(12) United States Patent
Ferrage et al.

(10) Patent No.: US 6,794,866 B2
(45) Date of Patent: Sep. 21, 2004

(54) SLOW DIFFUSION AND FLOW OF MOLECULES MEASURED BY PULSED FIELD GRADIENT NMR USING LONGITUDINAL MAGNETIZATION OF NON-PROTON ISOTOPES

(75) Inventors: Fabien Ferrage, Paris (FR); Geoffrey Bodenhausen, Paris (FR)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 10/435,253

(22) Filed: May 12, 2003

(65) Prior Publication Data

US 2003/0222646 A1 Dec. 4, 2003

(30) Foreign Application Priority Data

May 29, 2002 (EP) .............................. 02011929

(51) Int. Cl.$^7$ ................................. G01V 3/00
(52) U.S. Cl. ...................... 324/307; 324/309
(58) Field of Search ................ 324/307, 309, 324/306, 318

(56) References Cited

U.S. PATENT DOCUMENTS

2003/0222646 A1 * 12/2003 Ferrage et al. .............. 324/306

FOREIGN PATENT DOCUMENTS

EP 1367406 * 12/2003

OTHER PUBLICATIONS

E.O. Stejskal and J.E. Tanner, J. Chem. Phys. 42, 288–292 (1965).
J.E. Tanner, J. Chem. Phys. 52, 2523 (1970).
G. Wider, V. Dotsch and K. Wüthrich, J. Magn. Reson. A 108, 255 (1994).
A. Jerschow and N. Müller, J. Magn. Reson. 125, 372–375 (1997).
C.S. Johnson, Prog. NMR Spec. 34, 203–256 (1999).
A.S. Altieri, D.P. Hinton and R.A. Byrd, J. Am. Chem. Soc. 117, 7566–7567 (1985).
O. Vinogradova, F. Sönnischen and C.R. Sanders II, J. Biomol. NMR 4, 381–386 (1998).
S. Grzesiek and A. Bax. J. Am. Chem. Soc. 115, 12593–12594 (1993).
M. Piotto, V. Saudek and V. Sklenar, J. Biomol. NMR 2, 661–665 (1992).
H. Barjat, G.A. Morris and A. S. Swanson, J. Magn, Reson. 131, 131 (1998).
De Graaf R A et al: "In vivo / sup 31/P–NMR diffusion spectroscopy of ATP and phosphocreatine in rat skeletal muscle" Biophysical Journal, Apr. 2000, Biophys. Soc. USA, vol. 78, No. 4, pp. 1657–1664, XP002216645 ISSN: 0006–3495 see pp. 1657–1661.
Seo Yoshiteru et al: "Restricted diffusion of an 19F–labelled organic acid in human erythrocytes analyzed by 19F pulsed field gradient NMR." Japanese Journal of Physiology. vol. 45. No. 2. 1995. pp. 229–239. XP 002216646. ISSN:0021–521X see chapters 'Materials and Methods' and pp. 233–235.
I. Keresztes et al: "Diffusion–Ordered NMR Spectroscopy (DOSY) of THF Solvated n–Butyllithium Aggregates" Journal of the American Chemical Society, vol. 122, 2000, pp. 10228–10229, XP002216415 see the whole document.

* cited by examiner

*Primary Examiner*—Brij B. Shrivastav
(74) *Attorney, Agent, or Firm*—Paul Vincent

(57) ABSTRACT

A pulsed field gradient NMR (=nuclear magnetic resonance) method using stimulated echoes for determining the translational isotropic or anisotropic diffusion coefficient of a molecule or supra-molecular assembly or the flow rate and direction of fluids containing such molecules is characterized in that the molecule or supra-molecular assembly contains one or several isotopes (X) of non-zero nuclear spin other than protons having longitudinal relaxation times T1(X) that are longer than the longitudinal relaxation times T1(H) of the protons, and that the information about the localization of the molecule or supra-molecular assembly during the diffusion or flow interval is temporarily stored in the form of longitudinal magnetization of said isotope or isotopes. Thus, the determination of translational diffusion coefficients or flow rates of supra-molecular assemblies or molecules with short T1(H) values, in particular of supra-molecular assemblies or molecules with M≧50 kDa is accomplished.

8 Claims, 3 Drawing Sheets

SLOW DIFFUSION AND FLOW OF MOLECULES MEASURED BY PULSED FIELD GRADIENT NMR USING LONGITUDINAL MAGNETIZATION OF NON-PROTON ISOTOPES

This application claims Paris Convention priority of EP 02 011 929.3 filed May 29, 2002 the complete disclosure of which is hereby incorporated by reference.

BACKROUND OF THE INVENTION

The invention concerns a pulsed gradient NMR (=nuclear magnetic resonance) method using stimulated echoes for determining the translational isotropic or anisotropic diffusion coefficient of a molecule or supra-molecular assembly or the flow rate and direction of fluids containing such molecules.

A pulsed field gradient NMR method using stimulated echoes is known from A. S. Altieri, D. P. Hinton and R. A. Byrd, J. Am. Chem. Soc. 117 (1985), p. 7566–7567.

In order to determine the translational diffusion coefficient or the flow rate of a macromolecule pulsed field gradient NMR using stimulated echoes can be applied. With suitable hydrodynamic models, it is then possible to estimate the radius and the mass of the macromolecule.

However, slow diffusion coefficients $D<10^{-10}$ m$^2$/s or small flow rates, which are typically associated with biological macromolecules or supra-molecular assemblies with masses M$\geq$50 kDa, are difficult to measure with this method.

This is due to the rapid longitudinal relaxation of the protons in state of the art measurements.

In methods employing stimulated echoes (STEs), the information about the localization of the molecules is temporarily stored in the form of longitudinal magnetization during a diffusion interval (i.e. a diffusion time) $\Delta$. Usually, the magnetization of protons is used for these experiments, since protons have a favorable gyromagnetic ratio and, of course, protons are present in effectively all macromolecules and biological materials.

However, if during the time of longitudinal relaxation of protons T1(H) no significant diffusion or flow takes place, no determination of the translational diffusion constant or the flow rate can be done. This means materials with short T1(H) values, as compared with the times necessary for significant translational diffusion or flow, are excluded from the above mentioned measurement methods of the state of the art.

One of the principal hurdles that must be overcome prior to the determination of the structures of amphiphilic membrane proteins by solution-state NMR is the optimization of the solubilization of these proteins by suitable lipids, detergents or amphiphilic polymers ("amphipols"). Ideally, the hydrophobic surface of the protein should be covered with the slightest possible layer of solubilizing agent, so that the overall mass of the resulting assembly remains as small as possible. If the overall mass is much larger than that of the protein itself, this translates into slow rotational diffusion, long tumbling correlation times $\tau_c$, broad NMR lines, and hence poor resolution and sensitivity.

There are several approaches to the determination of the size of a supra-molecular assembly comprising a protein and its associated solubilizing agents: the kinetics of sedimentation during ultra-centrifugation, diffusion through membranes with well-defined pores, chromatography with suitable molecular sieves, neutron diffraction and pulsed-field gradient NMR. The latter method can provide a measurement of the translational diffusion coefficient D. With suitable hydrodynamic models, it is then possible to estimate the radius and hence the mass of macromolecular assemblies. Slow diffusion coefficients $D<10^{-10}$ m$^2$s$^{-1}$ associated with biological macromolecules or supra-molecular assemblies with masses M$\geq$50 kDa are difficult to measure by standard pulsed-field gradient NMR methods (1–5) using stimulated echoes because of rapid longitudinal relaxation of the nuclei (usually protons) that carry the information about the localization of the molecules during the diffusion interval.

The success of the original pulsed field gradient spin-echo NMR method due to Stejskal and Tanner (1) has lead to the development of many variants, particularly methods that employ so-called stimulated echoes (STE's) where the information about the localization of the molecules is temporarily stored in the form of longitudinal magnetization (2). Such experiments are usually carried out using the magnetization of protons, because of the favorable gyromagnetic ratio that allows one to 'encode' the initial spatial position with good accuracy without resorting to very intense gradients. Byrd and co-workers (6) have adapted a method (5) with an additional interval where the information is stored in the form of longitudinal proton magnetization to allow eddy currents to die out. More recent experiments allow one to circumvent undesirable effects of eddy currents by using so-called 'bipolar gradients' (3). It has also been shown recently that diffusion can be distinguished from flow or convection (4). The development of novel experimental methods has been accompanied by substantial efforts to extract reliable information from the attenuation of the signals as a function of the amplitude of the gradients, which should ideally obey a Gaussian function. The rates of these decays can be estimated by various approaches using inverse Laplace transformations. This has lead to so-called DOSY (Diffusion Ordered Spectroscopy) representations (5), i.e. two-dimensional plots where the diffusion coefficients appear along the ordinates while the chemical shifts are responsible for the dispersion along the abscissas.

The storage of the information in the form of longitudinal proton magnetization is of course subject to spin-lattice relaxation $T_1(^1H)$. In macromolecules such as proteins and nucleic acids, this typically limits the useful duration of the diffusion interval $\Delta$. In samples with masses on the order of 50 kDa, one has typically $T_1(^1H)=30$ ms so that the diffusion interval must be limited to about $\Delta=30$ ms (if $\Delta=T_1(^1H)$, the loss in signal intensity is $\exp\{\Delta/T_1(^1H)\}=e^{-1}=0.37$). This limitation means that very small translational diffusion constants D are difficult to measure. In practice, conventional stimulated echo (STE) methods (6) involving proton magnetization using a 600 MHz spectrometer equipped with standard triple-axes gradients, have proven to be difficult if $D\leq 10^{-10}$ m$^2$s$^{-1}$. For instance, the diffusion coefficient of an aqueous solution of the protein Ubiquitin (D=2.4 10$^{-10}$ m$^2$s$^{-1}$ at 30° C. for a mass of M=8 kDa) can be readily determined by the previously described method. The conventional stimulated echo method STE (6) has also been used for supra-molecular assemblies of high molecular weight (7), where it is possible to measure the diffusion coefficient of a highly mobile polyhistidine tag that has been attached to the protein and that has relatively narrow lines and slow proton spin-lattice relaxation. However, the construction of such fusion proteins is time-consuming. It can be shown that conventional STE methods are inadequate to determine the diffusion coefficient of an assembly of protein OmpA with detergent (D=$10^{-10}$ m$^2$s$^{-1}$ for a mass of M=50 kDa) in the absence of a polyhistidine tag.

In view of these deficiencies in prior art, it is the object of the invention to present a pulsed-field gradient NMR method that allows the determination of translational diffusion coefficients or flow rates of supra-molecular assemblies or molecules with short T1(H) values, in particular of supra-molecular assemblies or molecules with M≧50 kDa.

SUMMARY OF THE INVENTION

This object is achieved, according to the invention, by a pulsed field gradient method as mentioned above, characterized in that the molecule or supra-molecular assembly contains one or several isotopes (X) of non-zero nuclear spin other than protons having longitudinal relaxation times T1(X) that are longer than the longitudinal relaxation times T1(H) of the protons, and that the information about the localization of the molecule or supra-molecular assembly during the diffusion or flow interval is temporarily stored in the form of longitudinal magnetization of said isotope or isotopes.

So the standard isotope of magnetization storage, i.e. protons, is replaced by another isotope X of a different element according to the invention. Although this isotope has a lower gyromagnetic ratio and therefore provides less NMR intensity than protons, it is preferred because of a longer longitudinal relaxation time T1(X). Thus, a useful storage of localization information can be granted during a diffusion interval Δ that is longer than T1(H).

In a highly preferred variant of the inventive method, one of the isotopes is nitrogen-15. Nitrogen-15 can easily be enriched in most supra-molecular assemblies, since nitrogen is an abundant element in cross-linking bonds, e.g. in peptide bonds or within urethane plastics.

Alternatively or in addition, a variant of the method is characterized in that one of the isotopes is carbon-13. Carbon is present in all macromolecular assemblies or molecules, and carbon-13 can easily be enriched in case the natural content is insufficient for the intended measurement.

Also alternatively or in addition, in a variant of the method one of the isotopes is phosphorus-31. Phosphorus-31 is the only stable isotope of phosphorus, so if phosphorous is present within the supra-molecular assembly or molecule, it can readily be used for the inventive method.

In a preferred variant of the pulsed field gradient NMR method according to the invention, the molecule or supra-molecular assembly contains bio-molecules. For bio-molecules, there is a particular demand for determining their physical properties such as the translational diffusion coefficient or flow rate.

In a further development of this variant, the molecule or supra-molecular assembly comprises proteins and/or nucleic acids, solubilized by detergents or amphiphilic agents. Proteins and nucleic acids contain both nitrogen and carbon, so an investigation of the corresponding molecule or supra-molecular assembly is easy to realize with the inventive method.

A variant of the NMR method according to the invention is characterized in that subsequent to the determination of the translational diffusion coefficient the mass and radius of gyration of the molecule or supra-molecular assembly are calculated on the basis of a hydrodynamic model. Thus further physical properties of the molecule or supra-molecular assembly can be determined.

An inventive variant of the pulsed field gradient NMR method is characterized by application of a sequence of radio-frequency pulses to transfer the magnetization from protons to the said isotopes and back. This is a simple way of storing the information about the localization of the molecule or supra-molecular assembly temporarily in accordance with the invention.

A further variant of the inventive method is characterized by application of a sequence of radio-frequency pulses to convert the transverse magnetization perpendicular to the applied magnetic field of the said isotopes into longitudinal magnetization parallel to the applied magnetic field during an interval where translational diffusion or flow is monitored. This further details the storing of information about the localization of the molecule or macromolecular assembly during the diffusion interval Δ.

Also in accordance with the invention is a variant of the method wherein the following pulse sequence is applied:

i) 90° pulse acting on isotope X ii) pulsed field gradient to dephase transverse magnetization iii) selective 90° pulse in −x-direction acting on resonance of isotope H of solvent iv) 90° pulse in x-direction acting on isotope H v) pulsed field gradient to encode spatial position, wait delay time τ vi) simultaneously 180° pulse in x-direction acting on isotope H and 180° pulse in x-direction acting on isotope X vii) pulsed field gradient to encode spatial position, wait delay time τ viii) 90° pulse in y-direction acting on isotope H ix) selective 90° pulse in −y-direction acting on resonance of isotope H of solvent x) pulsed field gradient to dephase transverse magnetization xi) 90° pulse in x-direction acting on isotope X xii) pulsed field gradient to dephase transverse magnetization, wait delay time τ xiii) simultaneously 180° pulse in −x-direction acting on isotope H and 180° pulse in x-direction acting on isotope X xiv) pulsed field gradient to dephase transverse magnetization, wait delay time τ xv) 90° pulse in +x or −x-direction acting on isotope X xvi) pulsed field gradient to dephase transverse magnetization xvii) wait diffusion or flow interval Δ xviii) 90° pulse in +x or −x-direction acting on isotope X xix) pulsed field gradient to dephase transverse magnetization, wait delay time τ xx) simultaneously 180° pulse in x-direction acting on isotope H and 180° pulse in x-direction acting on isotope X xxi) pulsed field gradient to dephase transverse magnetization, wait delay time τ xxii) selective 90° pulse in −x-direction acting on resonance of isotope H of solvent xxiii) simultaneously 90° pulse in −x-direction acting on isotope H and 90° pulse in −x-direction acting on isotope X xxiv) pulsed field gradient to decode spatial position xxv) pulsed field gradient to dephase transverse magnetization, wait delay time τ xxvi) selective 90° pulse in x-direction acting on resonance of isotope H of solvent xxvi) simultaneously 180° pulse in −x-direction acting on isotope H and 180° pulse in x-direction acting on isotope X xxvii) selective 90° pulse in x-direction acting on resonance of isotope H of solvent xxviii) pulsed field gradient to decode spatial position xxix) pulsed field gradient to dephase transverse magnetization, wait delay time τ xxx) acquire H signal with $\tau=(4J_{HX})^{-1}$, and $J_{HX}$ being the scalar coupling constant of isotopes H and X, and Δ being a selectable time parameter with Δ>>τ. This describes one simple way to access the above-mentioned advantages of the inventive method.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is further illustrated by means of the drawings.

DESCRIPTION OF THE PREFERRED EMBODIMENT

Figure 1:
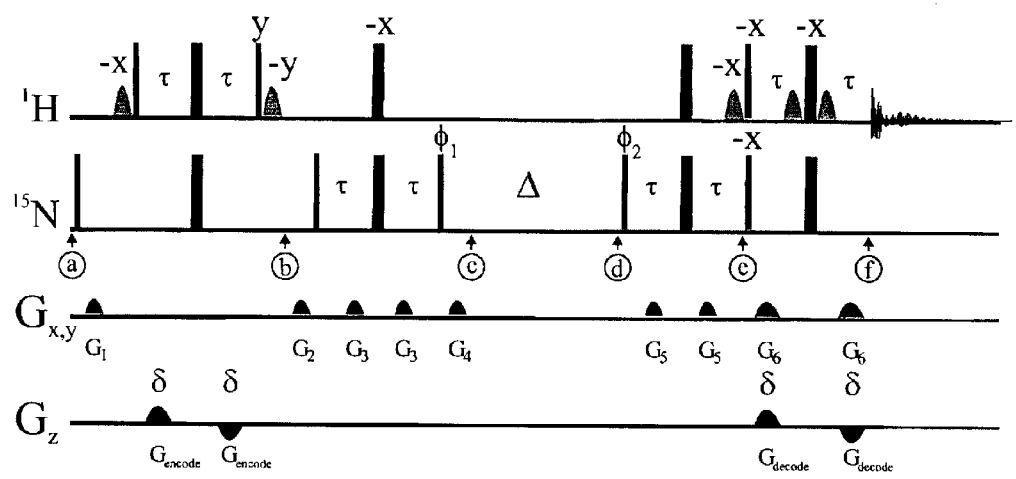
FIG. 1 shows a pulse sequence for the measurement of diffusion or flow coefficients in accordance with the invention.

To estimate the radius and hence the mass of macromolecular assemblies comprised of amphiphilic membrane proteins solubilized by detergents, translational diffusion coefficients D have been measured with a novel pulsed-field gradient NMR method. In this new approach, the information about the localization of the molecules is temporarily stored in the form of longitudinal magnetization of isotopes such as nitrogen-15, thus allowing one to increase the duration of the diffusion interval by up to two orders of magnitude because of long spin-lattice relaxation times. Unlike standard NMR methods using pulsed-field gradients and stimulated echoes, which are not suitable to measure the diffusion of biological macromolecules or supra-molecular assemblies, the new method can be extended to determine diffusion coefficients well below $D=10^{-10}$ $m^2s^{-1}$ corresponding to molecular masses larger than 100 kDa. The method is illustrated by applications to an aqueous solution of the hydrophobic transmembrane part of the bacterial Outer Membrane Protein OmpA solubilized in octyl-polyoxyethylene micelles. The diffusion coefficient is found to be close to $D=10^{-10}$ $m^2s^{-1}$ which corresponds to an effective mass of about 50 kDa, i.e. 19 kDa for the protein itself and about 30 kDa for the bound detergent.

In accordance with the invention, the useful duration of the diffusion interval can be considerably increased by storing the information in the form of longitudinal magnetization of less abundant isotopes such as nitrogen-15, which usually have much longer spin-lattice relaxation times than protons. This allows one to gain more than one order of magnitude in the measurement of D, so that diffusion coefficients of molecules with molecular mass higher than 100 kDa should be amenable to study. The method is illustrated by applications to an aqueous solution of the transmembrane part of the bacterial Outer Membrane Protein OmpA solubilized in octyl-polyoxyethylene micelles. The diffusion coefficient is found to be close to $D=10^{-10}$ $m^2s^{-1}$ which corresponds to an effective mass of about 50 kDa, i.e. 19 kDa for the protein itself and about 30 kDa for the bound detergent.

Since nitrogen-15 enrichment is a prerequisite for most modern bio-molecular NMR methods, we assume that solubilization studies can be carried out with isotopically enriched proteins or nucleic acids. It is therefore possible to transfer magnetization between amide protons $^1H^N$ and $^{15}N$ nuclei through the scalar couplings $^1J(^1H^N,^{15}N) \approx -95$ Hz. Most hetero-nuclear correlation methods exploit the advantages of the favorable dispersion of the $^{15}N$ chemical shifts in so-called HSQC representations. In the present paper however, we do not use the $^{15}N$ chemical shifts, but we exploit another favorable feature of $^{15}N$ spins in bio-molecules: the fact that their longitudinal relaxation times $T_1(^{15}N)$ are usually much longer than the $T_1(^1H)$ of the protons. Typically, in the solutions of OmpA protein with detergent discussed below, $T_1(^{15}N) \approx 1$ s whereas $T_1(^1H) \approx 30$ ms. This makes it attractive to store the information in the form of longitudinal nitrogen magnetization $N_z$. We shall refer to the new method as "X-STE" for "longitudinal homonuclear magnetization stimulated echoes".

FIG. 1 shows a pulse sequence designed for the measurement of diffusion coefficients using storage of longitudinal nitrogen-15 magnetization with stimulated echoes ($N_z$-STE). Narrow and wide pulses represent 90° and 180° pulses respectively. Unless otherwise stated, all pulses are applied along the x-axes of the doubly rotating frame. The sine-shaped gray pulses are water flip-back pulses (8), typically Gaussian 90° pulses of 1.2 ms duration. Such pulses are also used between points e and f to suppress the solvent signal with the 'Watergate' method (9). The perpendicular gradients $G_x$ or $G_y$ are used to purge unwanted magnetization components. These gradients can also be applied along the z-axis provided suitable precautions are taken to avoid accidental refocusing. The initial 90° nitrogen-15 pulse at point a and the subsequent gradient $G_1$ serve to saturate the equilibrium nitrogen magnetization. The gradients $G_z$ of duration δ=1.3 ms and variable amplitude $G_{encode}$ and $G_{decode}$ are used for 'bipolar encoding' in the first two τ delays and for 'bipolar decoding' in the last two τ delays. Their effect can be summed up by the factor $\kappa=\gamma_1 sG_{max}\delta$ where $\gamma_1$ is the (proton) gyromagnetic ratio, s the surface of the (usually not rectangular) shape of the gradient pulses $G_{encode}$ and $G_{decode}$, $G_{max}$ their peak gradient amplitude, and δ their duration. The phase accumulated by the magnetization during each gradient pair is proportional to the spatial position of the molecule along the vertical z-axis of the sample, $\phi=2\kappa z$. The peak amplitudes $G_{max}$ were incremented from 5.6 to 52.9 G.cm$^{-1}$ to dephase (and later re-phase) the transverse proton magnetization during the τ intervals. At point b, after an INEPT-type sequence with $\tau=(4J_{HN})^{-1}=2.72$ ms ($J_{HN}=-92$ Hz), the longitudinal two-spin order $2 H_z N_z \cos(2\kappa z)$ is spatially modulated along the z axis of the sample tube because of the two bipolar gradient pulses, slightly attenuated by the factor $\exp\{-D\kappa^{2\tau'}\}$ because of the onset of diffusion between encoding and point b (for simplicity, we shall assume that the two encoding gradients are close to each other, and that they are both separated by an interval τ from point b.) The sequence between points b and c with $\tau=(4J_{HN})^{-1}$ converts longitudinal two-spin order $2H_zN_z\cos(2\kappa z)$ into nitrogen-15 Zeeman order $N_z\cos(2\kappa z)$, now attenuated by a diffusion factor $\exp\{-D\kappa^2(\tau'+2\tau)\}$ at point c. The re-conversion of $N_z$ into observable proton magnetization $H_y$ at point f follows a roughly symmetrical path. Assuming again that the two decoding gradients are close to each other and separated by an interval τ from point e, the resultant signal is attenuated by translational diffusion during 6 short τ intervals and during the much longer α interval (in our case, the total duration was 200 ms). A four-step phase cycle ($\phi_1$=y, −y, y, −y, $\phi_2$=y, y, −y, −y, receiver phase $\phi_{rec}$=x, −x, −x, x) is used to eliminate signals of protons that are not coupled to $^{15}$N (isotope filtration) and to ensure that longitudinal relaxation causes the signals to converge asymptotically to zero rather than towards their equilibrium value.

The ratio of the signal S attenuated by diffusion (recorded with $G_{encode}=G_{decode}\neq 0$) and the reference signal $S_0$ (recorded with very weak gradient amplitudes) obeys the following equation $$S/S_0=\exp\{-D\kappa^2(\tau+2\tau'+4\tau)\} \quad (1)$$

Both the reference signal $S_0$ and the attenuated signal S are damped by transverse proton and nitrogen relaxation and by longitudinal nitrogen-15 relaxation, which may be expressed by a common factor $$f=\exp\{-4\tau/T_2(^1H)\}\exp\{-4\tau/T_2(^{15}N)\}\exp\{-\Delta/T_1(^{15}N)\} \quad (2)$$

This may be compared to a similar attenuation factor in the widely used homonuclear stimulated spin-echo (STE) method (Byrd and co-workers (6)):

$$f'=\exp\{-4\delta/T_2(^1H)\}\exp\{-\Delta/T_1(^1H)\} \quad (3)$$

It should be emphasized however that in equation (2) the delay τ is constrained to $\tau=(4J_{HN})^{-1}$, (say, 2.7 ms) while in equation (3) δ is equal to the duration of the bipolar gradients (say, 1 to 10 ms). In equations (2) and (3), the effective transverse relaxation rates are averages of the relaxation rates of in-phase and anti-phase coherences:

$$1/T_2(^1H)=\{1/T_2(I_x)+1/T_2(2I_xS_z)\}/2 \quad (4)$$

$$1/T_2(^{15}N)=\{1/T_2(S_x)+1/T_2(2I_zS_x)\}/2 \quad (5)$$

If we neglect for simplicity the effects of transverse relaxation in the τ intervals, the main difference between equations (2) and (3) lies in the factors $\exp\{-\Delta/T_1(^{15}N)\}$ and $\exp\{-\Delta/T_1(^1H)\}$. If we assume that we can accept a loss in signal intensity $\exp\{-I\}=0.35$ in both experiments, the delay Δ can be extended from ca 30 ms in the STE method to about 1 s in the new $N_z$-STE method, which opens the way to studying much slower diffusion constants.

The $N_z$-STE method was applied to a solution of a transmembrane segment of Outer Membrane protein A (OmpA) solubilized with the detergent octyl-polyoxyethylene. The protein was cloned in a strain of E. Coli using a plasmid. The bacterial culture was grown in a minimum M9 medium enriched in nitrogen-15, purified and re-natured. The NMR sample was a solution of 1 mM protein in a buffer of Tris with H$_2$O:D$_2$O=9:1 at pH=8.0 with 80 mg/ml of octyl-polyoxyethylene (C$_8$-POE). The CH$_3$(CH2)$_7$ octyl chain had a well-defined length, but the (CH$_2$O)$_n$ polyoxyethylene chain had a variable length with <n>=5. The detergent has an average molecular mass of 360 Da. The molar concentration of the free detergent was 240 mM. It was estimated from neutron diffraction evidence that the aggregates comprise 30 kDa detergent for each protein of 19 kDa.

Figure 2:
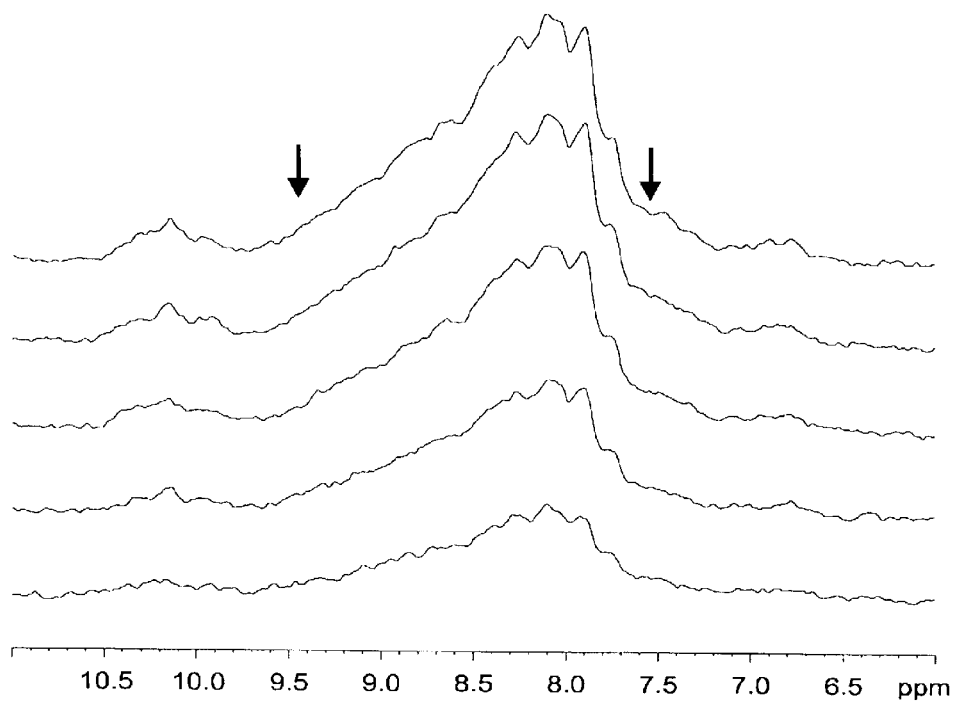
FIG. 2 shows one-dimensional nitrogen-15 filtered proton spectra of Outer Membrane protein A (OmpA) obtained by the inventive method with different amplitudes of field gradients.

Not surprisingly, the proton spectra of this solution of OmpA with detergent are rather poorly resolved. The dispersion of both $^1$H and $^{15}$N spectra (HSQC not shown) indicate that the protein is largely folded, but the resonances are broad and poorly resolved, probably because of some form of heterogeneity of the sample. Nevertheless, the experiment of FIG. 1 can be applied successfully, as shown in FIG. 2. This figure shows a one-dimensional nitrogen-15-filtered proton spectra, obtained with the $N_z$-STE sequence of FIG. 1, with a sample of the transmembrane segment of Outer Membrane protein A (OmpA) enriched in nitrogen-15 and solubilized in octyl-polyoxyethylene micelles in H$_2$O:D$_2$O=9:1 at pH=8.0 and T=30° C. The total diffusion interval was Δ+6τ=300 ms. The amplitudes of the gradients $G_{encode}=G_{decode}$ were incremented from 5.6 to 52.9 G.cm$^{-1}$. Each experiment was acquired with 512 transients, while the recovery delay between subsequent experiments was 1 s. Arrows indicate the limits of the region between 7.55 and 9.45 ppm over which the signal was integrated. Note that the signals stem from proton magnetization that has been transferred back and forth to nitrogen-15 nuclei, and that the overall pulse sequence lasted about 300 ms.

Figure 3:
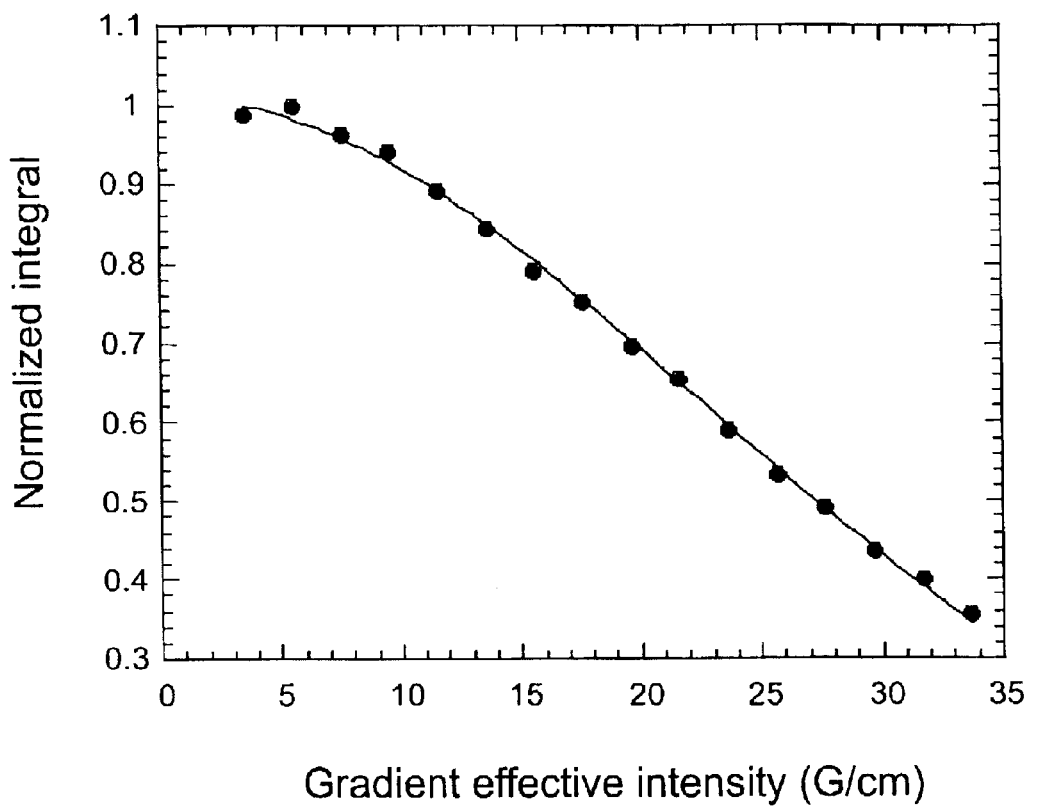
FIG. 3 shows the decay of the signal intensity of the OmpA-detergent complex of FIG. 2 as a function of the amplitude of the field gradients.

FIG. 3 shows the Gaussian decay of the signal intensity of the OmpA-detergent complex of FIG. 2 at 30° C. as a function of the amplitudes of the encoding and decoding gradients $G_{encode}=G_{decode}$ which were incremented in 16 steps from 5.6 to 52.9 G.cm$^{-1}$. The proton signals where integrated over the amide region (see FIG. 2). The diffusion coefficient determined by fitting this decay to Equation (1) is $D=(9.84\pm 0.12).10^{-11}$ m$^2$.s$^{-1}$. For the sake of comparison, Tanford reports a diffusion coefficient $D=10.10^{-11}$ m$^2$.s$^{-1}$ for ovalbumin (45 kDa). Both are about a factor 20 slower that the diffusion coefficient of water, since $D(H_2O)=2.3.10^{-9}$ m$^2$.s$^{-1}$ at 30° C. The diffusion of the OmpA-detergent complex is a factor 2.4 slower than that of the protein Ubiquitin (M=8 kDa) in aqueous buffer at pH=5.5, for which we measured $D=2.4.10^{-10}$ m$^2$.s$^{-1}$ at 30° C. If we assume that diffusion of the OmpA-detergent complex is not impeded by the presence of micelles formed by excess detergent (the critical micellar concentration of the detergent is 8.4 mM at pH 6.5 and T=30° C.), this diffusion coefficient corresponds to a mass of about 50 kDa per complex, which must result from the association of 19 kDa for each protein and about 30 kDa of detergent, corresponding to about 80 detergent molecules for each protein.

Like in the study of Sanders and co-workers (7), the sequence proposed by Byrd and co-workers (6) allowed us to observe the polyhistidine tag of OmpA. However, the intense signals of the detergent led to dramatic variations of the baseline, which made the processing of the data difficult. Moreover, this experiment only enables the observation of the polyhistidine tag, which is exposed to the solvent. Exchange or cross-relaxation with water protons can thus lead to an overestimate of the diffusion constant of the protein-detergent complex. This effect can be partly avoided by pre-saturation of the water resonance, but this leads to a loss of signal (8). Finally, cross-relaxation between the proton and nitrogen magnetization may occur for long diffusion intervals Δ. This can be largely suppressed by applying (composite) π pulses to the nitrogen magnetization at Δ/4 and 3Δ/4 in the diffusion intervals.

In the case of the OmpA-detergent complex illustrated here, which is believed to have an overall mass of about 50 kDa and a rotational diffusion characterized by a correlation time $\tau_c$ of about 20 ns, the theoretical advantage is approximately $n \approx 30$ since $T_1(^{15}N) \approx 1$ s and $T_1(^1H) \approx 30$ ms. The larger the complex, the slower the diffusion constant, and the more favorable the factor n as long as nitrogen-15 nuclei relaxation is dominated by CSA and the dipolar interaction with its bound proton. One should also take into consideration losses due to transverse proton and nitrogen relaxation during the fixed $\tau$ intervals in the sequence of FIG. 1.

It has been shown that slow translational diffusion constants can be determined accurately for nitrogen-15 enriched bio-molecules or aggregates by using a variant of stimulated echo pulsed field gradient NMR where the information is stored in the form of longitudinal Zeeman magnetization of the nitrogen-15 nuclei. This method should considerably simplify the optimization of detergents and amphiphilic agents for the solubilization of membrane proteins.

Possible applications of the inventive method include:

Measurement of the spatial anisotropy of translational diffusion or the direction of flow by using encoding and decoding gradients in three orthogonal directions;

Measurement of isotropic or anisotropic translational diffusion of molecules in viscous fluids, electrolyte solutions, and liquid crystalline phases, including micellar and bicellar phases;

Measurement of isotropic or anisotropic diffusion or flow of molecules through porous solids such as zeolites, oil-containing rocks, aerogels, and other porous materials;

Measurement of isotropic or anisotropic diffusion or flow of molecules in fluids through devices containing macroscopic or microscopic channels and/or reactors;

Measurement of isotropic or anisotropic diffusion or flow of molecules contained in fluids, in particular blood, through vessels such as arteries and veins in living organisms; and Measurement of isotropic or anisotropic diffusion of molecules contained in fluids, in particular in blood, through organs, such as muscle, brain, liver, etc., both in-vivo and in-vitro.

REFERENCES (1) E. O. Stejskal and J. E. Tanner, J. Chem. Phys. 42, 288–292 (1965).
(2) J. E. Tanner, J. Chem. Phys. 52, 2523 (1970).
(3) G. Wider, V. Dotsch and K. Wuthrich, J. Magn. Reson. A 108, 255 (1994).
(4) A. Jerschow and N. Müller, J. Magn. Reson. 125, 372–375 (1997).
(5) C. S. Johnson, Prog. NMR Spec. 34, 203–256 (1999).
(6) A. S. Altieri, D. P. Hinton and R. A. Byrd, J. Am. Chem. Soc. 117, 7566–7567 (1985).
(7) O. Vinogradova, F. Sönnischen and C. R. Sanders II, J. Biomol. NMR 4, 381–386 (1998).
(8) S. Grzesiek and A. Bax, J. Am. Chem. Soc. 115, 12593–12594 (1993).
(9) M. Piotto, V. Saudek and V. Sklenar, J. Biomol. NMR 2, 661–665 (1992).
(10) H. Barjat, G. A. Morris and A. S Swanson, J. Magn. Reson. 131, 131 (1998).

We claim:

1. A method for pulsed field gradient NMR (=nuclear magnetic resonance) using stimulated echoes for determining a translational isotropic or anisotropic diffusion coefficient of a molecule or supra-molecular assembly and for determining a flow rate and flow direction of fluids containing such molecules, the method comprising the steps of:

a) selecting a molecule or supra-molecular assembly containing protons (H) and at least one isotope (X) having non-zero nuclear spin, the isotope having a longitudinal relaxation time T1 (X) which is substantially longer than a longitudinal relaxation time T1 (H) of protons; and b) irradiating a sequence of radio-frequency pulses onto the selected assembly to transfer magnetization from the protons to the isotope and to transfer said magnetization from the isotope back to the protons, wherein information concerning a localization of the molecule or supra-molecular assembly during a diffusion or flow interval is temporarily stored in a form of longitudinal magnetization of the isotope, c) wherein said sequence of radio frequency pulses converts a transverse magnetization of the isotope perpendicular to an applied magnetic field into a longitudinal magnetization parallel to the applied magnetic field during an interval where translational diffusion or flow is monitored.

2. The method of claim 1, wherein the isotope is nitrogen-15.

3. The method of claim 1, wherein the isotope is carbon-13.

4. The method of claim 1, wherein the isotope is phosphorus-31.

5. The method of claim 1, wherein the molecule or supra-molecular assembly contains bio-molecules.

6. The method of claim 5, wherein the molecule or supra-molecular assembly comprises proteins and/or nucleic acids, in solution with detergents or amphiphilic agents.

7. The method of claim 1, further comprising calculating a mass and radius of gyration of the molecule or supra-molecular assembly using a hydrodynamic model subsequent to a determination of a translational diffusion coefficient.

8. The method of claim 1, wherein the following sequence of pulses is applied:

i) a 90° pulse acting on isotope X;
ii) a pulsed field gradient to dephase transverse magnetization;
iii) a selective 90° pulse in a −x-direction acting on resonance of the protons of a solvent;
iv) a 90° pulse in an x-direction acting on the protons;
v) a pulsed field gradient to encode spatial position associated with a waiting delay time $\tau$;
vi) a simultaneously 180° applied pulse in an x-direction acting on the protons and 180° pulse in an x-direction acting on isotope X;
vii) a pulsed field gradient to encode spatial position associated with a waiting delay time $\tau$;
viii) a 90° pulse in a y-direction acting on the protons;
ix) a selective 90° pulse in a −y-direction acting on resonance of the protons in the solvent;
x) a pulsed field gradient to dephase transverse magnetization;
xi) a 90° pulse in the x-direction acting on isotope X;
xii) a pulsed field gradient to dephase transverse magnetization associated with a waiting delay time $\tau$;
xiii) a simultaneously applied 180° pulse in the −x-direction acting on the protons and a 180° pulse in the x-direction acting on isotope X;
xiv) a pulsed field gradient to dephase transverse magnetization associated with a waiting delay time $\tau$;

xv) a 90° pulse in the +x or −x-direction acting on isotope X;

xvi) a pulsed field gradient to dephase transverse magnetization;

xvii) a waiting diffusion or flow interval Δ;

xviii) a 90° pulse in the +x or −x-direction acting on isotope X;

xix) a pulsed field gradient to dephase transverse magnetization associated with a waiting delay time τ;

xx) a simultaneously applied 180° pulse in the x-direction acting on the protons and a 180° pulse in x-direction acting on isotope X;

xxi) a pulsed field gradient to dephase transverse magnetization associated with a waiting delay time τ;

xxii) a selective 90° pulse in the −x-direction acting on resonance of the protons of the of solvent;

xxiii) a simultaneously applied 90° pulse in a −x-direction acting on the protons and a 90° pulse in the −x-direction acting on isotope X;

xxiv) a pulsed field gradient to decode spatial position;

xxv) a pulsed field gradient to dephase transverse magnetization associated with a waiting delay time τ;

xxvi) a selective 90° pulse in the x-direction acting on resonance of the protons of the solvent;

xxvii) a simultaneously applied 180° pulse in the −x-direction acting on the protons and a 180° pulse in the x-direction acting on isotope X;

xxviii) a selective 90° pulse in an x-direction acting on resonance of the protons of the solvent;

xxix) a pulsed field gradient to decode spatial position;

xxx) a pulsed field gradient to dephase transverse magnetization associated with a waiting delay time τ; and xxxi) acquiring a proton signal, wherein $\tau=(4J_{HX})^{-1}$, $J_{HX}$ is a scalar coupling constant between protons and isotope X, and Δ is a selectable time parameter, wherein $\Delta \gg \tau$.

* * * * *